United States Patent [19]
Tew

[11] Patent Number: 5,481,118
[45] Date of Patent: Jan. 2, 1996

[54] ON-CHIP LIGHT SENSOR

[75] Inventor: Claude E. Tew, Dallas, Tex.

[73] Assignee: Texas Instruments Incorporated, Dallas, Tex.

[21] Appl. No.: 378,915

[22] Filed: Jan. 26, 1995

Related U.S. Application Data

[63] Continuation of Ser. No. 2,310, Jan. 8, 1993, abandoned.

[51] Int. Cl.$^6$ .................................................. G02B 27/00
[52] U.S. Cl. ........................................ 250/551; 250/214 R
[58] Field of Search ............................. 323/902; 250/205, 250/208.2, 214 AL, 551, 214 R

[56] References Cited

U.S. PATENT DOCUMENTS

| | | | |
|---|---|---|---|
| 4,015,117 | 3/1977 | Wicklund, Jr. | 250/208 |
| 4,038,555 | 7/1977 | Freeman | 250/573 |
| 4,230,265 | 10/1980 | Casaly | 235/455 |
| 4,291,979 | 9/1981 | Yuasa et al. | 356/218 |
| 4,663,521 | 5/1987 | Maile | 250/221 |
| 4,719,405 | 1/1988 | Boucher | 323/352 |
| 4,764,682 | 8/1988 | Swartz | 250/578 |
| 5,004,901 | 4/1991 | Yoshimoto et al. | 250/201.5 |
| 5,055,668 | 10/1991 | French | 250/208.2 |
| 5,055,669 | 10/1991 | Blake et al. | 250/124 AL |
| 5,126,721 | 6/1992 | Butcher et al. | 340/578 |
| 5,179,274 | 1/1993 | Sampsell | 250/208.2 |
| 5,233,180 | 8/1993 | Tsuruta et al. | 250/208.1 |
| 5,327,210 | 7/1994 | Okui et al. | 356/218 |

Primary Examiner—Peter S. Wong
Assistant Examiner—Adolf Berhane
Attorney, Agent, or Firm—Charles A. Brill; James C. Kesterson; Richard L. Donaldson

[57] ABSTRACT

A brightness sensing circuit for providing a binary electrical signal for indicating whether incident light exceeds a certain brightness. The circuit's light detector is a photodiode, whose output is amplified by a first current mirror. The circuit has a reference current source, whose output is amplified by a second current mirror. Both currents are delivered to a common node, whose voltage level transitions from low to high when the amplified input current exceeds the amplified reference current. This node is connected to the gate input of a CMOS inverter, which provides a binary output.

20 Claims, 1 Drawing Sheet

ON-CHIP LIGHT SENSOR

This application is a continuation of application Ser. No. 08/002,310, filed Jan. 8, 1993, now abandoned.

TECHNICAL FIELD OF THE INVENTION

This invention relates to electro-optical circuits, and more particularly to a circuit for determining when light radiated from a source exceeds a certain brightness.

BACKGROUND OF THE INVENTION

In some applications of visible light sources, it may be desirable to know when light radiated from the source exceeds a certain brightness. If it is known when the brightness is exceeded, controls such as source regulation or shut-off can be implemented.

Optical applications are becoming increasingly combined with semiconductor control circuits. Also, even some of the optical circuits are capable of being realized with semiconductor fabrication techniques. An example of using semiconductor techniques to fabricate an optoelectrical device is the fabrication of spatial light modulators, especially those known as "deformable mirror devices" or "digital micromirror devices". These devices consist of an array of tiny micro-mechanical mirror elements, which are movable between at least two positions and reflect light to an image frame if positioned so that light is reflected in that direction. The mirror elements are controlled and individually addressed with electrodes. The mirror elements, as well as the addressing circuit, can be manufactured on a single semiconductor substrate.

Various types of light detectors are available that can be used to detect light and to generate some sort of signal if the brightness exceeds a certain level. However, it would be advantageous to have such a circuit that could be easily implemented as an integrated circuit, together with other circuitry. If the circuit were simple and small, it could be implemented as a control subcircuit on a larger opto-electrical device.

U.S. Pat. No. 5,179,274, issued Jan. 12, 1993, entitled "Method for Controlling Operation of Optical Systems and Devices" describes a logic circuit that uses two photo transistors to detect a low limit and a high limit of illumination. A need exists for an alternative circuit that uses only one photosensitive device to detect an upper limit.

SUMMARY OF THE INVENTION

A first aspect of the invention is a circuit for providing an electrical signal to indicate when incident light exceeds a certain level of brightness. A photodiode detects incident light and generates an input current. A first current mirror receives and amplifies this input current and delivers the amplified input current to an intermediate node. A current source provides a reference current. A second current mirror receives and amplifies this reference current and delivers the amplified reference current to the intermediate node. An inverter receives a gate current from the intermediate node if the amplified input current exceeds the amplified reference current, and thereby provides a binary output depending on that relationship.

A technical advantage of the invention is that it may be easily fabricated as an integrated circuit, either as a stand alone device or as a peripheral control circuit for some other device.

DETAILED DESCRIPTION OF THE INVENTION

Figure 1:
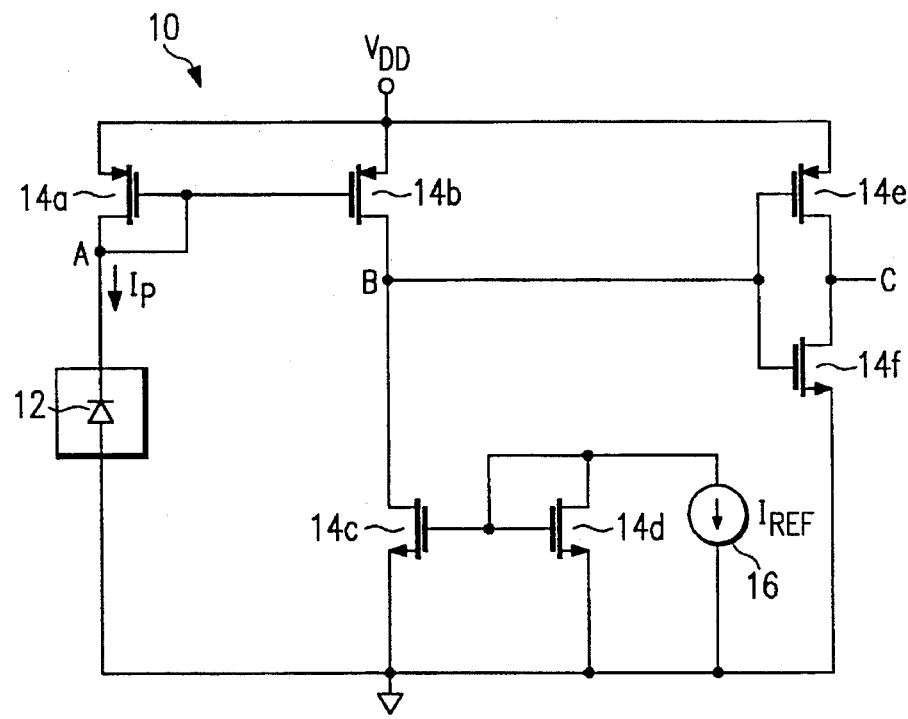
FIG. 1 illustrates a brightness sensing circuit in accordance with the invention.

FIG. 1 illustrates a brightness-sensing circuit 10 in accordance with the invention. Circuit 10 comprises a photodiode 12, six transistors 14a–14f, and a current source 16. Each of these elements may be fabricated using MOS (metal oxide semiconductor) fabrication techniques. Although this description is in terms of MOS devices, in particular MOSFET's, it should be understood that the same circuit 10 could also be implemented with bipolar transistor devices.

As indicated in FIG. 1, various connections are made to a common ground, which may be the substrate of a semiconductor device. A voltage source is connected at $V_{DD}$ to provide a standard power source as is appropriate for the particular transistors being used. For example, a 5 volt power source might be used for MOS devices.

In general terms, circuit 10 generates a "high" or "low" signal at node C, with the value at node C depending on whether the brightness of light incident on photodiode 12 is above a predetermined threshold. The signal at node C can be used as a binary code, which may be used to make a decision whether to shut off the incident light, or which may be simply stored for historical purposes. Alternatively, a binary signal can be delivered to an automatic control circuit (not shown in FIG. 1).

Photodiode 12 may be any conventional photodiode device. It may be a discrete device, or may be fabricated as part of an integrated circuit that contains all of circuit 10. The anode of photodiode 12 is connected to the substrate or other common ground. Its cathode is connected to a current comparator comprised of transistors 14a–14d, and then to an inverter comprised of transistors 14e and 14f.

All transistors 14a–14f are MOSFETs (MOS field effect transistors). Their drain, source, and gate connections are indicated in FIG. 1. Transistors 14a, 14b, and 14e are p-channel type transistors; transistors 14c, 14d, and 14f are n-channel type. Although not shown in FIG. 1, in the case where circuit 10 is an integrated circuit, substrate connections are to the transistor sources.

The current from photodiode 12 is received into a current mirror consisting of transistors 14a and 14b.

As is the case with conventional MOSFET current mirrors, the amount of current mirrored by transistor 14b is a function of the relative size of transistors 14a and 14b, i.e., their relative channel width and channel length. Transistor 14b provides an amplified input current at node B.

Current source 16 generates a current, $I_{Ref}$. The amount of current provided by current source 16 is set so that, as explained below, at a desired threshold of the amplified input current, there is a transition in the voltage level at node B. Ideally, current source 16 is adjustable, so that circuit 10 can be set for different thresholds. The current reference 16, can be integrated as a part of circuit 10, or can be provided as an externally generated input.

The current from current source 16 is received into a current mirror consisting of transistors 14c and 14d. Transistor 14c provides an amplified reference current to node B.

Transistors 14e and 14f have a gate input current that is determined by the voltage at node B. They form a CMOS inverter, such that a high voltage at node B results in a low voltage at node C, and vice versa.

In operation, incident light, $L_I$, illuminates the surface of circuit 10. All devices are shielded from the light except for photodiode 12. The shielding can be accomplished using a metal fabrication level. Photodiode 12 receives this incident light, and in response, generates a current, $I_p$, which is amplified by transistor 14b to node B. The current from current source 16, $I_{Ref}$, is amplified by transistor 14c to node B. When the current from transistor 14b exceeds the current from transistor 14c, the voltage level at node B goes "high". This provides a gate input current to the inverter formed by transistors 14e and 14f. In response to the gate input current, the output at node C undergoes a transition from a high state to a low state.

As an example of using circuit 10, it is desired to use circuit 10 to indicate when the brightness level of $L_I$ exceeds 2000 lumens. The size and other properties of the particular photodiode 12, which is 17 microns square, indicate that this level of brightness will cause an $I_P$ of approximately 5 microamps. This estimation may vary according to the quantum efficiency of the particular diode 12, but can be predicted or experimentally obtained using known techniques. The current mirror ratios, and the current-generating capability of current source 16 are selected so that when $I_P$ exceeds 5 microamps, the current from transistor 14b will be greater than the current from transistor 14c at node B. This will cause the voltage at node B to go high, and cause the binary output at node C to go low.

Figure 2:
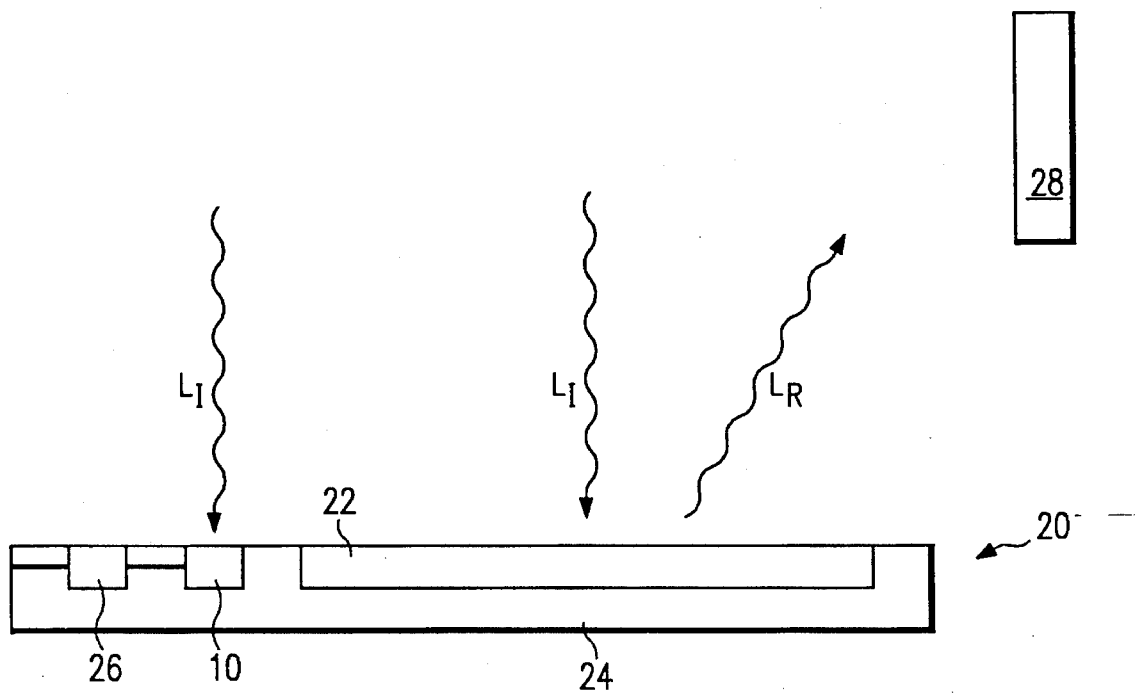
FIG. 2 illustrates a deformable mirror device that includes the brightness sensing circuit of FIG. 1.

FIG. 2 illustrates circuit 10 as a subcircuit of a deformable mirror device (DMD) 20. The pixel element array and its addressing circuit 22 are fabricated on a substrate 24. Circuit 10 is fabricated on the same substrate 24, as a peripheral control circuit. In operation, circuit 10 receives the same incident light, $L_I$, as does the pixel element array 22. The reflected light, $L_R$, is desired to remain under a certain threshold. The relationship between $L_I$ and $L_R$ is some ratio, depending on the quantum efficiency of the pixel element array 22. Thus, a certain value of $L_I$ can be predicted to result in a certain value of $L_R$, and circuit 10 may be used to determine if the value of $L_I$ will result in an $L_R$ that is above the threshold.

If the light reflected from DMD 20 exceeds the threshold, the voltage at node C goes high in the manner described above in connection with FIG. 1. This signal can be communicated to a control circuit 28, and used to shut off operation of the DMD 20. For example, control circuit 28 might include a master clock, whose operation could be stopped by a signal from circuit 10.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A circuit for providing an electrical signal to indicate when incident light exceeds or falls below a certain level of brightness, comprising:

a photodiode for detecting incident light and generating an input current;

a first current mirror for receiving and amplifying said input current and delivering the amplified input current to an intermediate node;

a current source for providing a reference current;

a second current mirror for receiving and amplifying said reference current and for delivering the amplified reference current to said intermediate node; and an inverter for receiving the current from said intermediate node and for changing state at its output when said amplified input current exceeds said amplified reference current.

2. The circuit of claim 1, wherein at least one of said current mirrors is comprised of a pair of transistors with a common gate connection to said input current.

3. The circuit of claim 2, wherein said transistors are field effect transistors.

4. The circuit of claim 1, wherein said inverter is comprised of a pair of transistors with a common gate connection to said reference current.

5. The circuit of claim 4, wherein said transistors are field effect transistors.

6. The circuit of claim 1, wherein said current mirrors and said inverter are comprised of MOS field effect transistors.

7. The circuit of claim 1, wherein said current source is adjustable.

8. The circuit of claim 1, wherein said current mirrors and said inverter are fabricated as an integrated circuit.

9. A monolithic device which includes a deformable mirror and a circuit for indicating the brightness level of light incident on the mirror, comprising:

at least one micro-mechanical mirror element on said device; and a shut-off circuit on said monolithic device comprising a photodiode for receiving a portion of said light incident on said monolithic device and providing an input current, a first current mirror for amplifying said input current to an intermediate node, a current source for providing a reference current, a second current mirror for amplifying said reference current to said intermediate node, and an inverter connected to said intermediate node for providing a binary output depending on the voltage at said intermediate node.

10. The deformable mirror device of claim 9 wherein said binary output affects the operation of said at least one micro-mechanical mirror element.

11. The device of claim 9, wherein at least one of said current mirrors is comprised of a pair of transistors with a common gate connection to said input current.

12. The device of claim 11, wherein said transistors are field effect transistors.

13. The device of claim 9, wherein said inverter is comprised of a pair of transistors with a common gate connection to said intermediate node.

14. The device of claim 13, wherein said transistors are field effect transistors.

15. The device of claim 9, wherein said current mirrors and said inverter are comprised of MOS field effect transistors.

16. The device of claim 9, wherein said current source is adjustable.

17. The device of claim 9, further comprising an addressing circuit for addressing each of said mirror elements.

18. The device of claim 17, wherein said shut-off circuit is fabricated on the same substrate as said addressing circuit.

19. The deformable mirror device of claim 9 further comprising a light source, wherein said binary output affects the operation of said light source.

20. A method of measuring incident light comprising;
generating an input current based on the level of said incident light;
amplifying said input current;
providing a reference current;
outputting a first signal level when the magnitude of said amplified input current exceeds the magnitude of said reference current; and
outputting a second signal level when the magnitude of said reference current exceeds the magnitude of said amplified input current.

* * * * *